United States Patent
Lee et al.

(10) Patent No.: US 6,278,720 B1
(45) Date of Patent: Aug. 21, 2001

(54) HIGH POWER SEMICONDUCTOR LASERS WITH RIDGE WAVEGUIDE STRUCTURE

(75) Inventors: Jung Kee Lee; Kyung Hyun Park; Dong Hoon Jang; Chul Soon Park, all of Daejeon (KR)

(73) Assignees: Electronics and Telecommunications Research Institute, Daejeon; Korea Telecom, Seoul, both of (KR)

( * ) Notice: Subject to any disclaimer, the term of this patent is extended or adjusted under 35 U.S.C. 154(b) by 0 days.

(21) Appl. No.: 09/119,391

(22) Filed: Jul. 21, 1998

(30) Foreign Application Priority Data

Sep. 29, 1997 (KR) .................................. 97-49766

(51) Int. Cl.⁷ .................................. H01S 5/10; H01S 5/16
(52) U.S. Cl. .................................................. 372/46
(58) Field of Search .................................................. 372/46

(56) References Cited

U.S. PATENT DOCUMENTS

| | | | |
|---|---|---|---|
| 5,043,291 | 8/1991 | Devoldere et al. | 437/24 |
| 5,160,492 | 11/1992 | Wang et al. | 437/22 |
| 5,469,457 | 11/1995 | Nagai et al. | 372/45 |
| 5,815,522 | * 9/1998 | Nagai | 372/46 |
| 5,870,419 | * 2/1999 | Nakayama | 372/46 |

OTHER PUBLICATIONS

F.R. Gfeller et al., "High–Power Single–Mode AiGaAs Lasers with Bent–Waveguide Nonabsorbing Etched Mirrors", 1992 American Institute of Physics, Sep. 15, 1992, pp. 2131–2135.

M. Sagawa et al., "High–Power, Highly–Reliable Operation of InGaAs/InGaAsP $0.98\mu m$ Lasers with an Exponential–Shaped Flared Stripe", Electronic Letters, vol. 32, No. 24, Nov. 21, 1996, pp. 2277–2279.

* cited by examiner

Primary Examiner—James W. Davie
(74) Attorney, Agent, or Firm—Jacobson Holman PLLC

(57) ABSTRACT

A $0.98 \mu m$ semiconductor laser of a ridge waveguide (RWG) structure includes: to be lengthen the durability of a semiconductor laser by increasing a catastrophic optical damage (COD) level, a ridge having a fixed width and length so that the strip may stop in the position of $30 \mu m$ on the basic of end portion of an output facet along length direction of a resonator; and a non-waveguide region in the end portion of both sides of a resonator.

4 Claims, 10 Drawing Sheets

HIGH POWER SEMICONDUCTOR LASERS WITH RIDGE WAVEGUIDE STRUCTURE

BACKGROUND OF THE INVENTION

1. Field of the invention

The present invention relates to a high power semiconductor laser, and more particularly to a high power semiconductor laser of a ridge waveguide (RWG) structure having an increased catastrophic optical damage (COD) level, and to method of fabricating a semiconductor laser device of a ridge waveguide structure.

2. Description of the Prior Art

A semiconductor laser having a wavelength of 0.98 μm has been used to amplify signal through an optical fiber as a source of light of the erbium doped fiber amplifier (EDFA). The larger the optical power of 0.98 μm semiconductor laser, the more the optical amplification rate of the EDFA is increased. Accordingly, the fabrication of 0.98 μm semiconductor laser having a high optical power has been interested.

But, when the optical power of a semiconductor laser increases, the durability of a semiconductor laser is limited, the main cause being local heating due to optical absorption in the output facets that can result in catastrophic optical damage (COD).

To solve the above-mention problems, a bent-waveguide nonabsorbing mirror (NAM) structure, an exponential-shaped flared stripe structure, or an ion-implantation into the output facets are proposed.

The conventional method of fabricating a semiconductor laser of a ridge waveguide (RWG) structure having a wavelength of 0.98 μm will be explained with reference of FIG. 7 to 11.

FIG. 7 is a cross-sectional view of RWG semiconductor laser of RWG structure according to a conventional method.

One of the conventional methods will now be described with FIG. 7.

First, as shown in FIG. 7, a GaInAsP graded layer 102, a GaInP cladding layer 103, a GaInAsP graded layer 104, a GaInAs/GaInAsP active layer 105, a GaInAsP graded layer 106, a GaInP cladding layer 107, a GaInAsP graded layer 108, and a GaAs ohm contact layer 109 are grown by metal organic vapor phase epitaxy(MOVPE), in this order, on the GaAs substrate 101.

Next, a silicon nitride film and a photoresist are successively deposited on the grown substrate, and a photoresist is patterned to form a ridge composed of 2 to 3 μm width and 20 μm channel width by conventional photolithographic and selective etching steps. After removing the photoresist, a GaAs ohm contact layer 109, a GaInAsP graded layer 108, and a GaInP cladding layer 107 are selectively removed by wet etching using the silicon nitride film as a mask.

After removing the silicon nitride film used as a mask, a silicon nitride film 110 is deposited on the entire surface, and open the contact windows using photolithograpy and etching technique of the top surface of the ridge. Sequentially, the first p side electrode and the second p side electrode 111 of approximately 2 to 3 μm thickness by using Au platting process are successively formed. The GaAs substrate grinds to be remain a thickness of approximately 100 μm, and a n side electrode 112 is formed on the rear surface of the GaAs substrate 101.

In operation, when a forward bias voltage is applied across the substrate and the ohmic contact layer, current flows into the active layer through the ridge and carriers are confined in the active layer, resulting in carrier recombinations that produce laser light, The laser light by optical gain is generated in the active layer having 2 to 3 μm width and 600 to 1000 μm length in the lower portion of the ridge. The laser light generated by optical gain like this is injected in the vicinity of the active layer by a difference in refractive index of each layer along in the longitudinal direction of the active layer and a difference in effective refractive index of the lower portion and its expected portion of the ridge along in the horizontal direction of the active layer.

Accordingly, the active layer shape composed of the resonator of RWG semiconductor laser is combined by mixing gain-guiding wave and refractive index-duiding, The active layer of a stick shape of a rectangle has some enlarged shape along in the horizontal direction, that is, the length come under a resonator length of RWG semiconductor laser, and the width of a rectangle is some larger than the ridge width.

In case of operating a conventional RWG semiconductor laser like this in accordance with high injection current, the higher optical power density is formed at the output facets, and the active layer absorbe a part of the optical power. Accordingly, the output facet that can result in catastrophic optical damage (COD) is abruptly destructed by the local heating due to optical absorption.

Another conventional method illustrated in FIGS. 8 and 9 is adapted to solve the destruction problem of the output facet due to COD. FIGS. 8 and 9 are cross-sectional view showing a RWG semiconductor laser of the bent-waveguide nonabsorbing mirror (NAM) structure proposed to rise the COD level.

As shown in FIG. 8, first, a GaAs substrate 113 with exact [100] orientation is formed a 1 μm-deep channel for laser stripe parallel to [01-1] by wet etching. And a n type AlGaAs cladding layer 114, a single-quantum-well graded-refractive-index separae-confinement heterostructure (SQW-GRINSCH) layer 115, and a p type AlGaAs cladding layer 116 are then grown on the nonplanar substrate by molecular beam epitaxy (MBE). Next, after depositing a silicon nitride film and a photoresist on the grown substrate, the ridge of 3.5 μm width and 1.25 μm depth by dry etching using the silicon nitride film as a mask is formed.

Subsequently, after removing the a silicon nitride film used as a mask, a silicon nitride film 117 is deposited on the entire of the ridge, and a p side electrode 118 is then formed. The output facet trench of 6 μm depth is formed by chemical assisted ion-beam etching (CAIBE). After coating with Al2O3 layers in the output facets, a n side electrode 119 is then formed. This structure restrains the optical absorption so that the laser optical power is seceded from active layer of the output facet region, since the laser resonator is moved to the longitudinal direction at the output facet region. In case NAM region of this structure, the laser light generated from the active layer is coupled with AlGaAs cladding layer that has a high band gap and is not generated an optical absorption. Accordingly, a size of the beam patterns is getting bigger, and the temperature of the output facets is getting lower.

Other conventional method illustrated in FIG. 10 is adapted to reduce the COD generating in the output facets of the RWG structure due to the high optical power density. Generally, when the active layer is narrow, the kink is decreased. But, the degradation characteristics of the output facets is increased by increasing the optical power density.

FIG. 10 is a stripe structure for semiconductor laser with exponential-shaped flared stripe.

As shown in FIG. 10, the stripe width is wider at the front to reduce the optical power density. It is narrower at the rear facet to achieve stable lateral-mode operation. These two regions are connected by an exponential-shaped flared stripe 120 that produces a smooth mode-transition due to the electrical field along the cavity taking an exponential form. The optical power density is decreased by enlarging an optical power distribution proceeding along the resonator since the end portion of the active layer makes an exponential-shaped flared stripe. In case of this structure, the optical power level 121 caused by a COD is enlarged at the front facet A still conventional method illustrated in FIG. 11 is adapted to rise the COD level by ion-implanting a dopant impurity in vicinity of the optical power facets.

FIG. 11 is a cross-sectional view showing a conventional semiconductor laser of a window structure.

First, as shown in FIG. 7, a n type AlGaAs cladding layer 123, a AlGaAs/AlGaAs quantum well layer 124, a p type AlGaAs first cladding layer 125, a p type AlGaAs etching stop layer 126, a p type AlGaAs second cladding layer 127, and a p type AlGaAs first ohm contact layer 128 are epitaxially grown successively in this order on the n type GaAs substrate 122.

Next, an insulating film and a photoresist are successively deposited on the entire surface of the wafer, and an insulating film is patterned to form a Si implant region by conventional photolithography. The facet region of a p type AlGaAs first ohm contact layer 128, a p type AlGaAs second cladding layer 127, and a p type AlGaAs etching stop layer are selectively removed by wet etching using the insulating film as a mask, and then Si implantation is processed.

Here, the quantum well layer structure is not distorered by ion-implantatiom and it is for the first time disordered when silicon atoms are diffused in crystals by some thermal process.

After removing the photoresist and insulating film for blocking the Si implantation. Sequentially, a n type AlGaAs current blocking layer 130 and a p type AlGaAs second contact layer 131 are selectively grown on the surface of the wafer. Then, a n side electrode is formed on the rear surface of the n type GaAs semiconductor substrate 122, and a p side electrode is formed on the p type GaAs second contact layer 131. However, this method also can not be solve the kink in spite of twice crystalline growth and ion-implantation As described above, the semiconductor lasers of RWG structure are difficult to system application because of a low COD level or the kink generated by a spatial hole burning in condition of a high current injection.

SUMMARY OF THE INVENTION

It is an object of the present invention to provide an improved semiconductor laser which does not suffer from the disadvantages of prior laser devices.

It is a further object of the present invention to provide a semiconductor laser having a high COD level as compared to prior lasers.

It is a still further object of the present invention to provide a semiconductor laser capable of increasing a current level due to the kink occurrence as compared to prior lasers.

Another object of the present invention is to provide a method for fabricating a semiconductor laser device having a high COD and current levels.

In accordance with one aspect of the present invention, a semiconductor laser device having a ridge waveguide (RWG) structure includes: a ridge having a predetermined width and a predetermined length so that a stripe stops at 30 μm from an end position of an output facet in a longitudinal direction of a resonator; and a with no waveguide region the in end portion of both sides of the resonator.

In accordance with another aspect of the present invention, a method of fabricating a semiconductor laser device includes: epitaxially growing a n type GaInAsP graded layer, a n type GaInP cladding layer, a GaInAsP graded layer, a GaInAs/GaInAsP active layer, a GaInAsP graded layer, a p type GaInP cladding layer, a p type GaInAsP graded layer, and a p+ type GaAs ohm contact layer successively in this order on the n type GaAs substrate; depositing an silicon nitride film and a photoresist on the grown semiconductor substrate, sequentially etching a photoresist to form patterns of a ridge, and forming a ridge using a reactive ion etching (RIE); forming a current injection window at the top of a ridge using photolithography and etching steps, and forming a first p side electrode using lift-off process; depositing a Ti/Au on the entire of a wafer, forming a second p side electrode pattern using photolithography, and sequentially forming a second p side electrode using Au platting process; grinding a n type GaAs substrate, and forming a n side electrode, after.

BRIEF DESCRIPTION OF THE DRAWINGS

These and other objects, and features and advantages of the invention, as well as the invention itself, will become better understood by reference to the following detailed description of the presently preferred embodiments when considered in conjunction with the accompanying drawings, wherein.

DETAILED DESCRIPTION OF THE PREFERRED EMBODIMENTS

Embodiments of the invention will be explained with reference to the drawings. FIGS. 1 to 6 are cross-sectional view showing a process steps in a method of fabricating a semiconductor laser according to the present invention.

Figure 1:
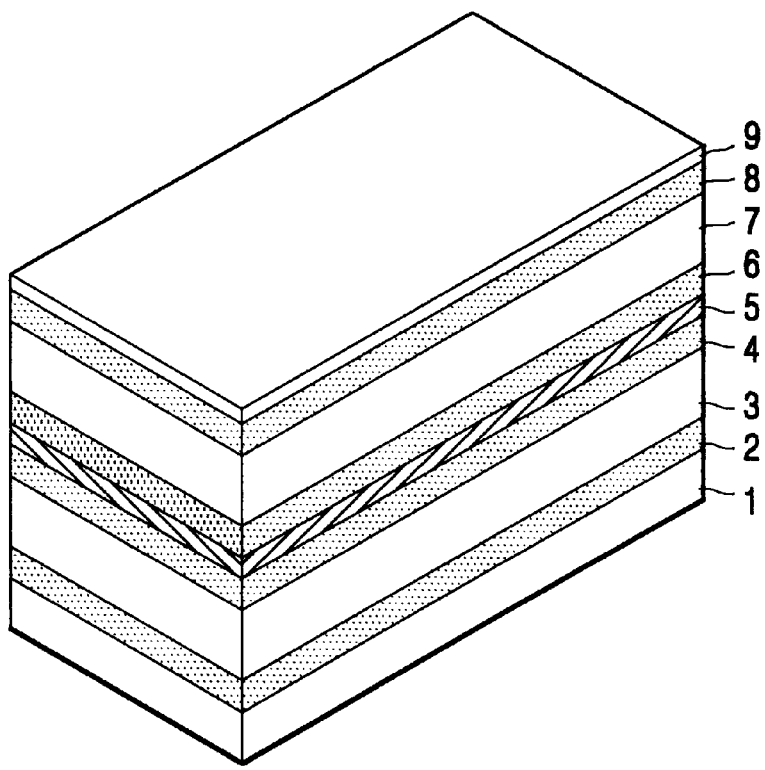
FIG. 1 is a cross-sectional view showing a process step of a crystalline growth in a fabrication method of a semiconductor laser according to the present invention.

First, as shown in FIG. 1, a n type GaInAsP graded layer 2, a n type GaInP cladding layer 3, a GaInAsP graded layer 4, a GaInAs/GaInAsP active layer 5, a GaInAsP graded layer 6, a p type GaInP cladding layer 7, a p type GaInAsP graded layer 8, and a p+ type GaAs ohmic contact layer 9 are successively grown by metal organic vapor phase (MOVPE), in this order, on the n type GaAs substrate 1. A GaAs etching stop layer is formed before a p type GaInP cladding layer 7.

Figure 2:
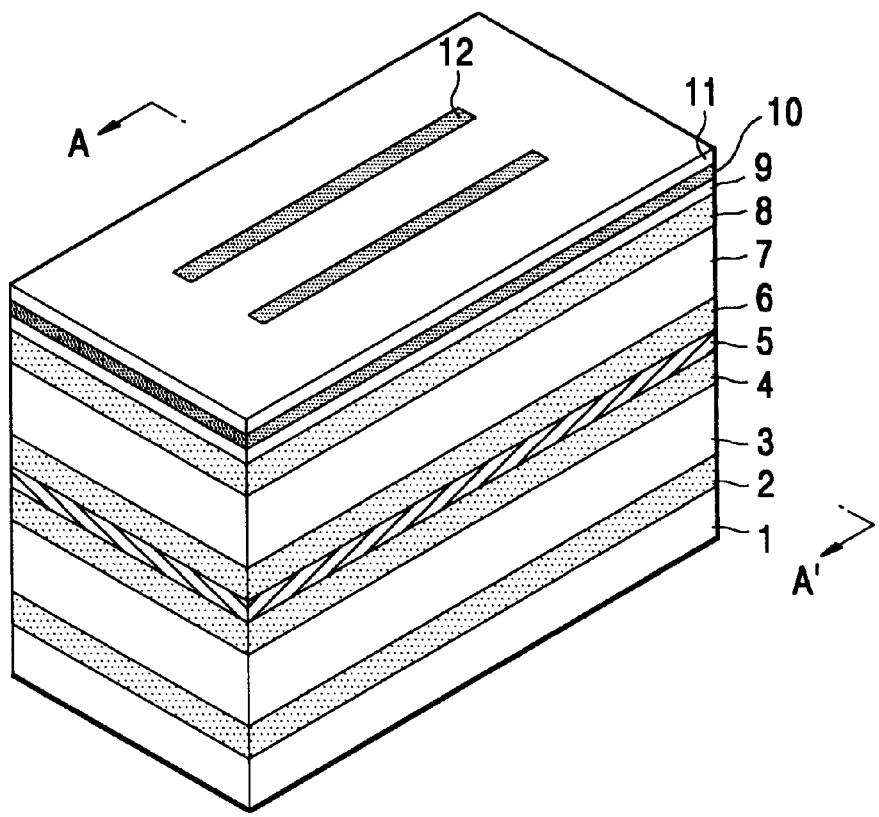
FIG. 2 is a plain view showing a process step of a photolithography in a fabrication method of a semiconductor laser according to the present invention.

Next, as shown in FIG. 2, a silicon nitride film 10 and a photoresist 11 are successively deposited on the grown substrate. A photoresist 11 is developed to form a twin stripe pattern 12 along the cavity of 3 to 4 $\mu$m width and the length of the stripe is stopped from the facet about 30 $\mu$m by conventional photolithography step.

Figure 3:
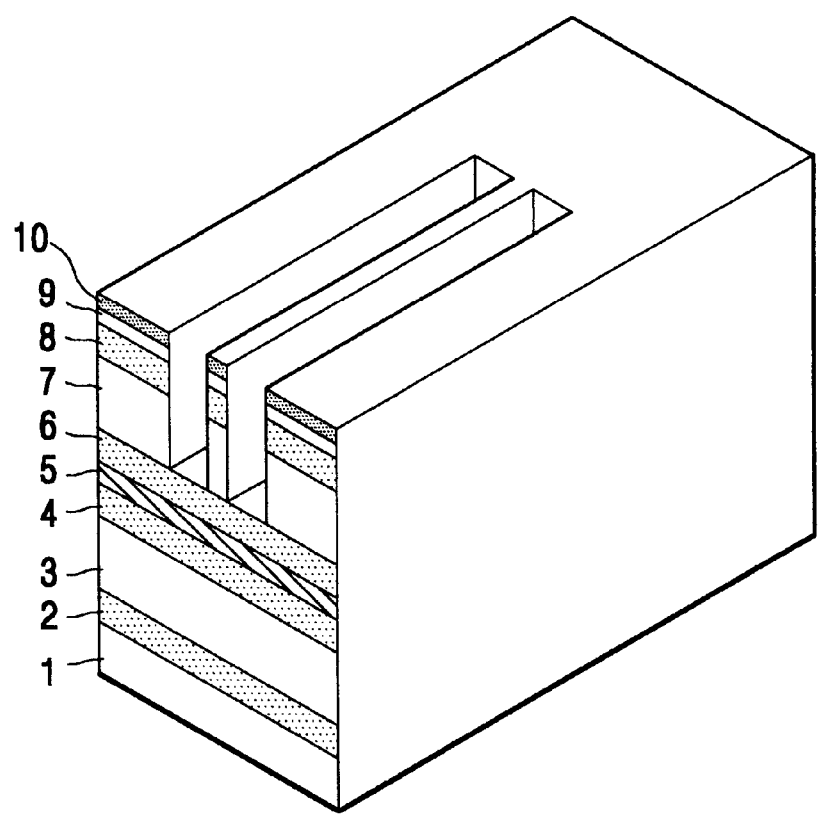
FIG. 3 is a cross-sectional view taken along the line A–A' of FIG. 2 after forming a ridge in a fabrication method of a semiconductor laser according to a first embodiment of the present invention.
Figure 4:
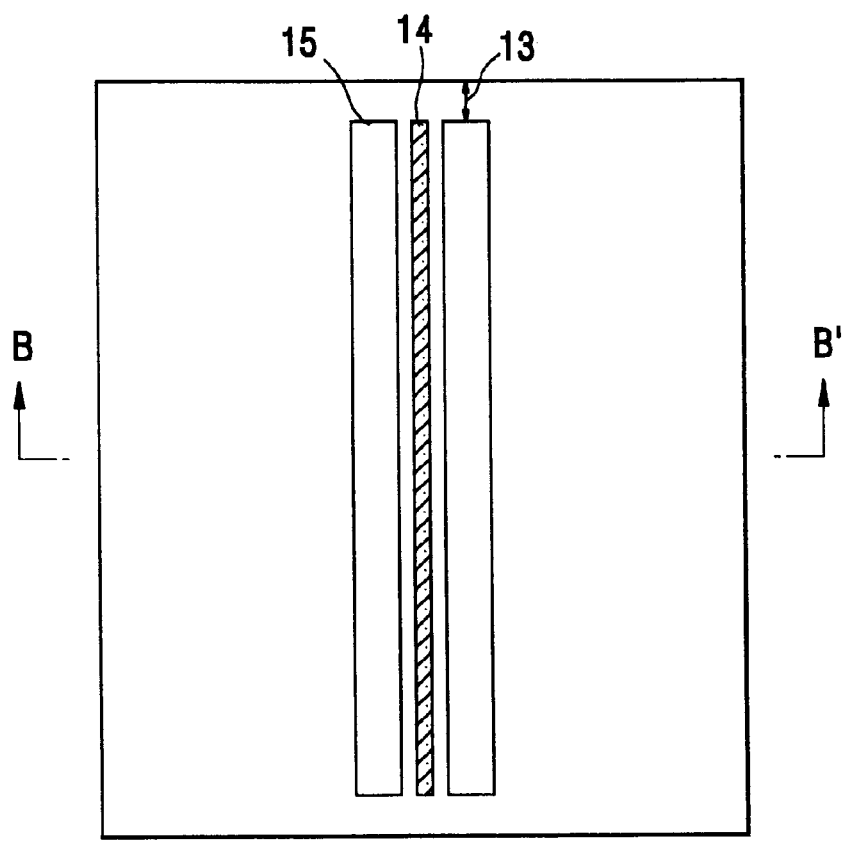
FIG. 4 is a plain view showing a process step of an ohmic contact metal formation on the ridge of a linear shape in a fabrication method of a semiconductor laser according to the present invention.

Sequentially, as shown in FIG. 3, after etching the silicon nitride film 11, a photoresist 11 is removed. a p+ type GaAs ohm contact layer 9, a p type GaInAsP graded layer 8, and a p type GaInP cladding layer 7 is etched to about 1 $\mu$m thickness by reactive ion etching (RIE) and the rest thickness by selective wet etching using the silicon nitride film as a mask.

After removing the silicon nitride film 11, a silicon nitride film and a photoresist are successively deposited on the entire surface of the etched ridge, and a silicon nitride film is patterned to form a current injection window at the top of the ridge. After removing the photoresist, the first p side electrode Ti/Pt/Au 14 is formed using lift-off process. In the FIG. 4, reference numerical 13 designates a region without a ridge and a waveguide at the both sides of a resonator. Reference numerical 15 designates an etched part.

Here, a region without a ridge and a waveguide in vicinity of the both sides of a resonator is not formed the ohmic contact metal 14. The resonator made up a liner shape.

Figure 5:
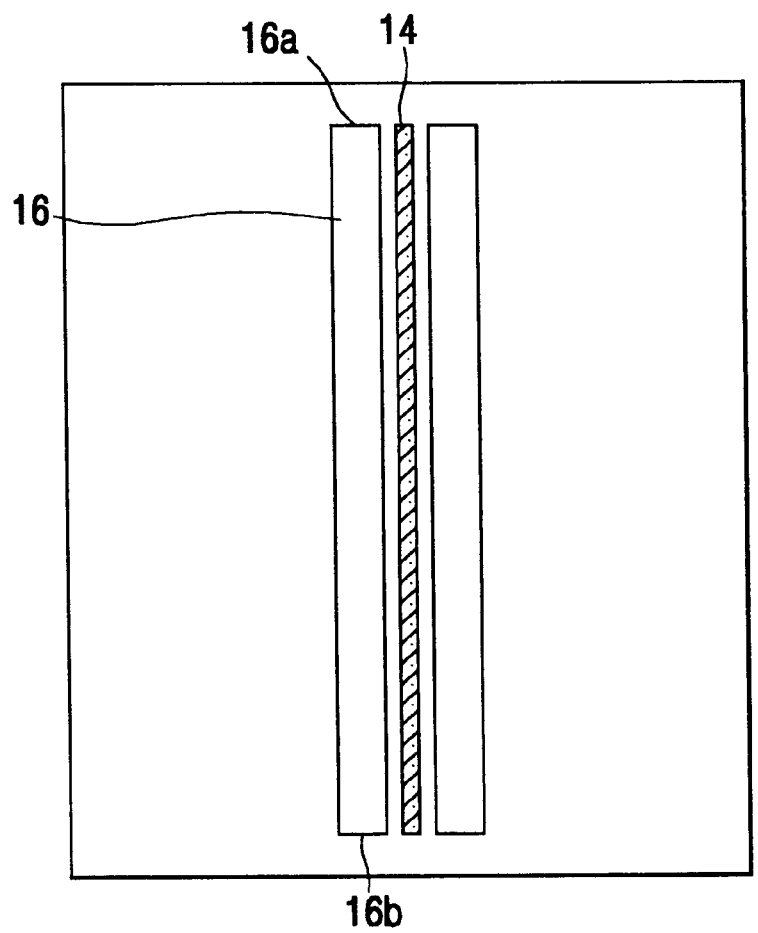
FIG. 5 is a plain view showing a process step of an ohmic contact metal formation on the ridge of a tapered shape in a fabrication method of a semiconductor laser according to the present invention.

FIG. 5 shows a resonator formed by taper shape differently a width according to resonator shape. An shown in FIG. 5, Reference numerical 16 designates a ridge of the taper shape. Here, the wide ridge width 16a and the narrow ridge width 16b are formed by 5 to 6 $\mu$m and 1.5 to 3 $\mu$m, respectively.

Figure 6:
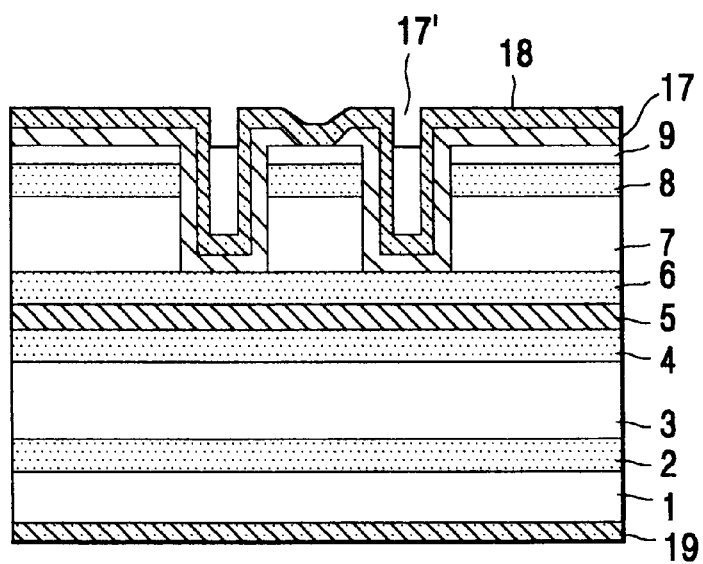
FIG. 6 is a cross-sectional taken along the line B–B' of FIG. 4
Figure 7:
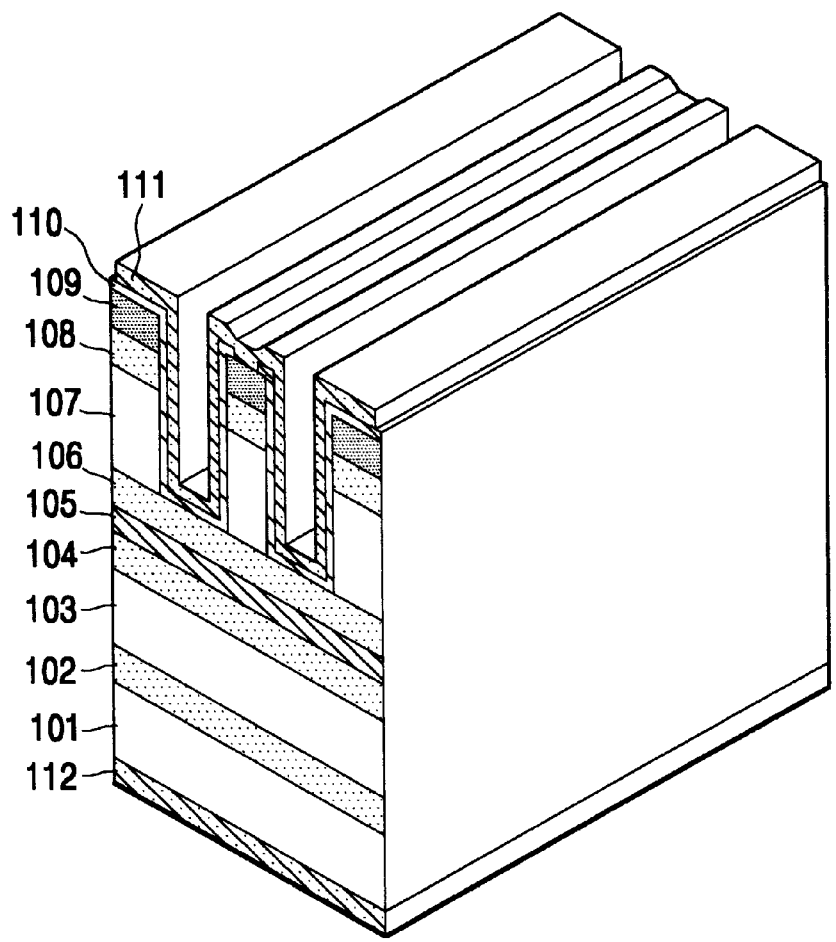
FIG. 7 is a cross-sectional view showing a conventional semiconductor laser of RWG structure.
Figure 8:
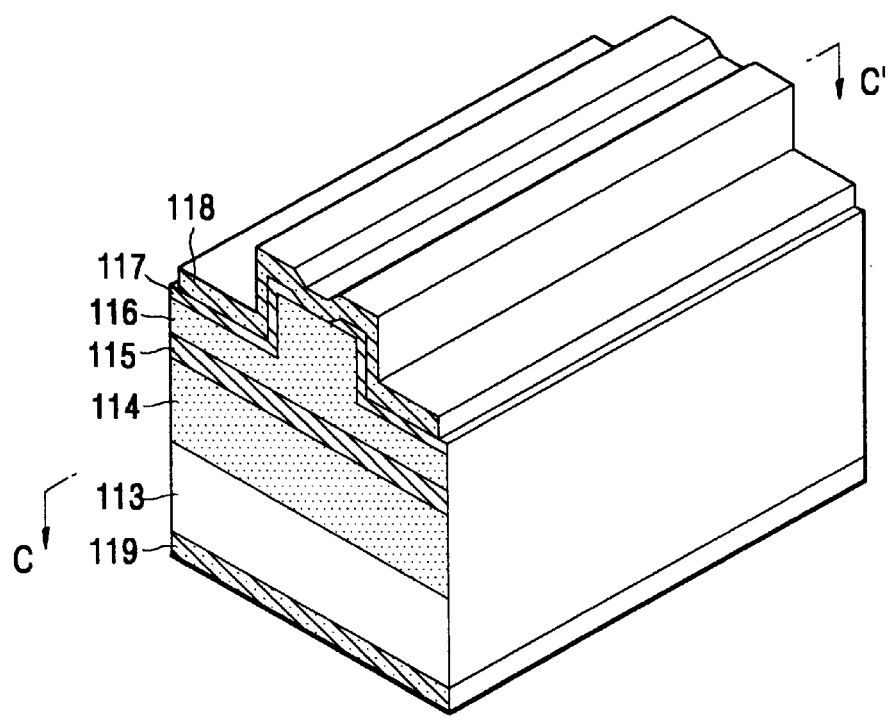
FIG. 8 is a cross-sectional view showing a conventional semiconductor laser of a bent-waveguide nonabsorbing mirror structure.
Figure 9:
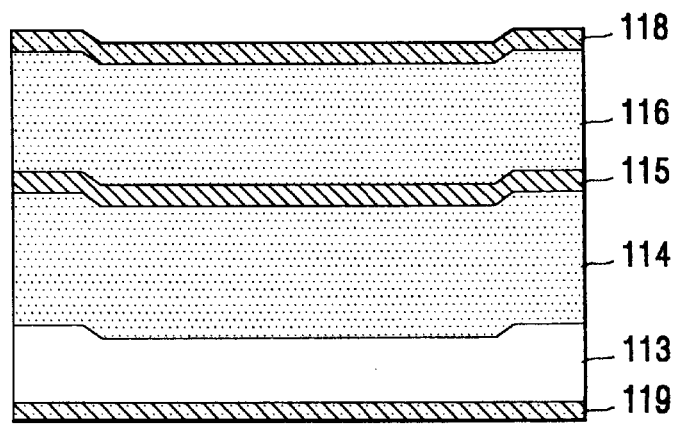
FIG. 9 is a cross-sectional view taken along the line C–C' of FIG. 8.
Figure 10:
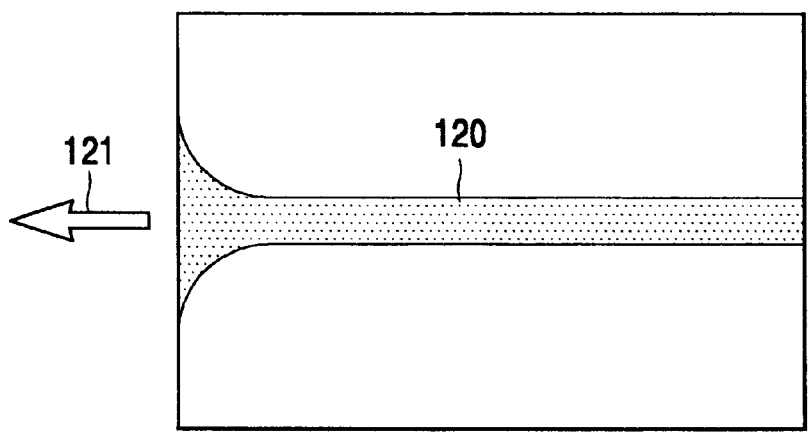
FIG. 10 is a plain view showing a conventional semiconductor laser of an exponential-shaped flared stripe structure.
Figure 11:
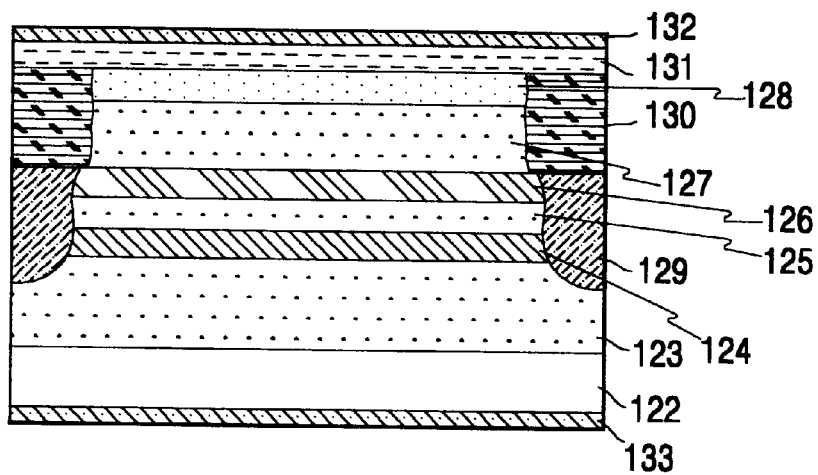
FIG. 11 is a cross-sectional view showing a conventional semiconductor laser carrying out an ion-implantation.

After this, as shown in FIG. 6, Ti/Au is formed on the entire surface of the wafer for Au plating. Sequently, The second p side electrode 18 of a thickness of approximately 2 to 3 $\mu$m is formed by Au plating process on the patterned electrode. The n type GaAs substrate grinds to be remain a thickness of approximately 100 $\mu$m. Also, a region without a ridge and a waveguide is not formed any electrode. A n side electrode 19 is formed on the rear surface of the n type GaAs substrate 1. Reference numerical 17 designates an insulating film formed in a region without a waveguide of the end portion of the ridge.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A semiconductor laser device having a ridge waveguide (RWG) structures comprising:

a ridge having a predetermined width and a predetermined length so that a stripe stops at 30 $\mu$m from an end portion of an output facet in a longitudinal direction of a resonator; and a region with no waveguide in the end portion of both sides of the resonator.

2. A semiconductor laser device as defined in claim 1, wherein said ridge is tapered such that both ends of the ridge have different widths.

3. A semiconductor laser device as defined in claim 2, wherein a wide end of the tapered ridge has a width ranging from 5 to 6 $\mu$m and a narrow end of the tapered ridge has a width ranging from 1.5 to 3 $\mu$m.

4. A semiconductor laser device as defined in claim 1, wherein said region is coated with gold so as not to cause an ohmic contact but to emit heat.

* * * * *